United States Patent [19]

Wu et al.

[11] 4,091,379
[45] May 23, 1978

[54] ANALOG TO DIGITAL WAVE SHAPING SYSTEM

[75] Inventors: Paul S. Wu, Randolph; Jagdish C. Tandon, Lake Hiawatha, both of N.J.

[73] Assignee: Litton Business Systems, Inc., Pine Brook, N.J.

[21] Appl. No.: 682,245

[22] Filed: May 3, 1976

[51] Int. Cl.² .................. H03K 13/02; G06K 7/10
[52] U.S. Cl. .................. 340/347 AD; 235/462; 307/268; 328/28; 364/487
[58] Field of Search .................. 340/347 AD, 146.3; 328/28, 34, 59, 132, 164; 307/268; 235/61.11 E; 364/487

[56] References Cited

U.S. PATENT DOCUMENTS

| | | | |
|---|---|---|---|
| 3,723,649 | 3/1973 | Pitegoff et al. | 328/164 |
| 3,766,411 | 10/1973 | Arnold | 328/132 |
| 3,790,894 | 2/1974 | Iizuka et al. | 328/34 |
| 3,838,347 | 9/1974 | Läuffer | 328/164 |
| 3,849,632 | 11/1974 | Eckert, Jr. et al. | 235/61.11 E |
| 3,869,666 | 3/1975 | Saltz et al. | 328/132 |
| 3,870,865 | 3/1975 | Schneiderhan et al. | 235/61.11 E |
| 3,898,571 | 8/1975 | Caprio | 328/164 |
| 4,000,397 | 12/1976 | Hebert et al. | 235/61.11 E |
| 4,007,377 | 2/1977 | Simon et al. | 235/61.11 E |

Primary Examiner—Felix D. Gruber
Attorney, Agent, or Firm—Robert F. Rotella; Norman Friedman

[57] ABSTRACT

An analog to digital wave shaping system comprising, a source of analog signals, adaptive threshold circuitry coupled to said source, said adaptive threshold circuitry having an output selected as a function of the intensity of said analog signal compared to a fixed intensity signal, and, comparator circuitry coupled to said source and to the output of said adaptive threshold circuitry.

3 Claims, 2 Drawing Figures

ANALOG TO DIGITAL WAVE SHAPING SYSTEM

BACKGROUND OF THE INVENTION

The present invention relates to a wave shaping circuit and more particularly to a circuit for converting an analog waveform to a digital waveform.

Although, the inventive circuit is of general utility wherever analog to digital wave shaping is required, a particular application is in conjunction with optical scanning apparatus utilized to decode bar codes. In particular, such scanning apparatus is used in point of sale (POS) applications where the bar codes appear on articles, either printed directly thereon or on associated indentification tags or labels. One particular form of bar code now widely utilized in the grocery industry is the Universal Product Code (UPC) which consists of a symbol having a plurality of parallel dark and light (or black and white) bars.

As the scanning apparatus scans the symbol, a waveform is generated having an amplitude which varies as a function of time from positive peaks associated with the sensed light bars to negative peaks associated with the sensed dark bars (or vice versa depending on the polarity of the light sensing system employed).

In practical applications, the analog signal contains wide variations in amplitude, depending on such factors as the printing colors used for the light and dark bars, reflectivity of the printing medium, presence of debris over the symbol, noise created by ambient light pickup, and so forth. Such variations may exist from symbol to symbol or, within a particular symbol, from bar to bar. However, decoding circuitry cannot function properly with analog signals which have such characteristics.

OBJECTS AND SUMMARY OF THE INVENTION

The present invention provides a system for converting an analog signal, which may have widely-varying amplitudes, to a digital signal containing well-defined pulses of a fixed amplitude, corresponding to the variations in the analog signal.

An object of this invention is, therefore, the conversion of an analog signal to a digital signal by means which can accept wide variations in the analog signal and which are immune to extraneous noise, such as is generated by ambient light falling on an optical sensor.

DETAILED DESCRIPTON OF THE INVENTION

Figure 1:
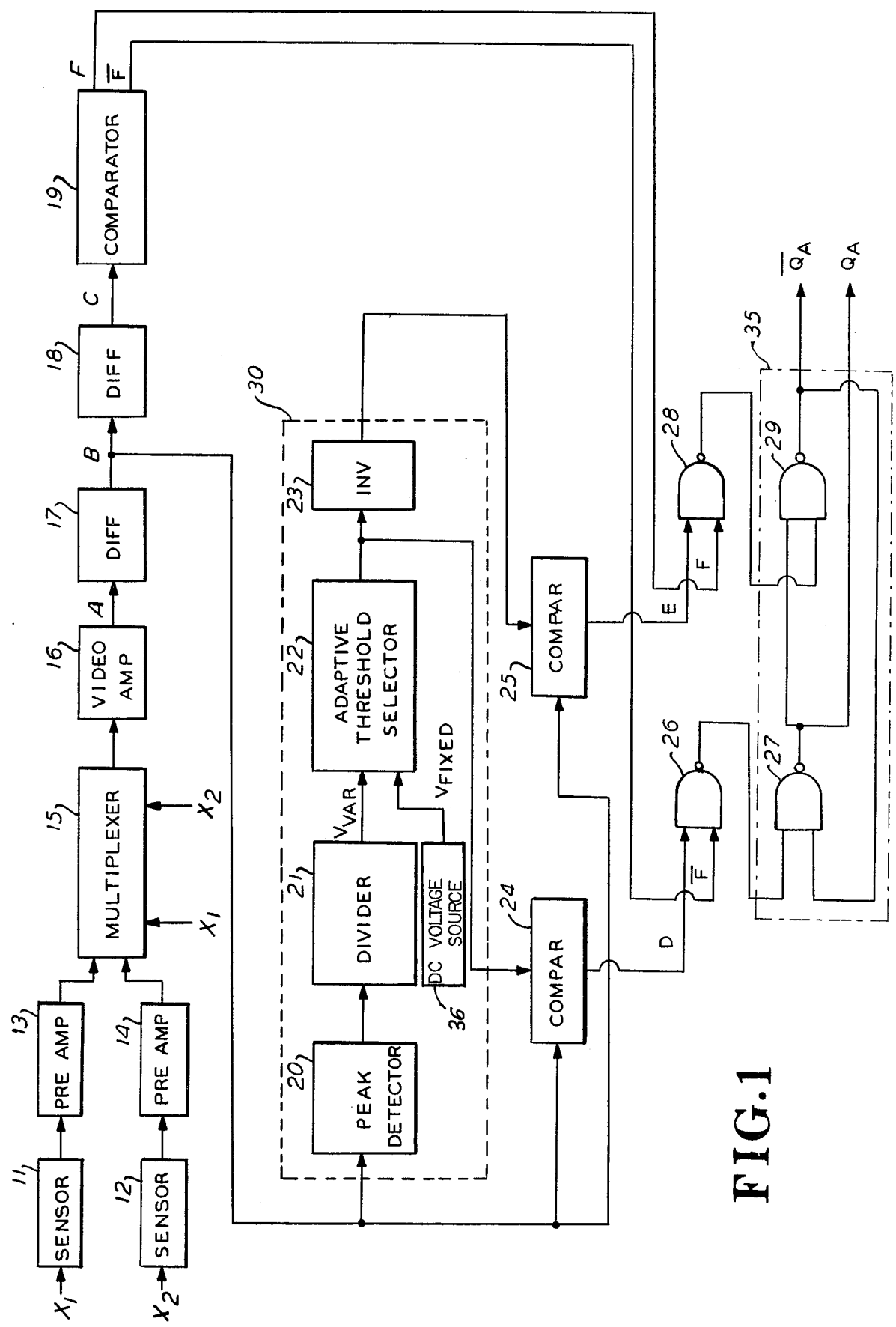
FIG. 1 is a schematic block diagram of the analog to digital wave shaping circuit, according to the invention.

Referring to FIG. 1, an analog signal which has an amplitude which may vary widely as a function of time is fed to a video amplifier 16. The output of the amplifier 16, shown as waveform A in FIG. 2, appears as an analog signal varying in time in which the polarity is selected so that the positive peaks represent white bars and the negative peaks represent black bars.

Figure 2:
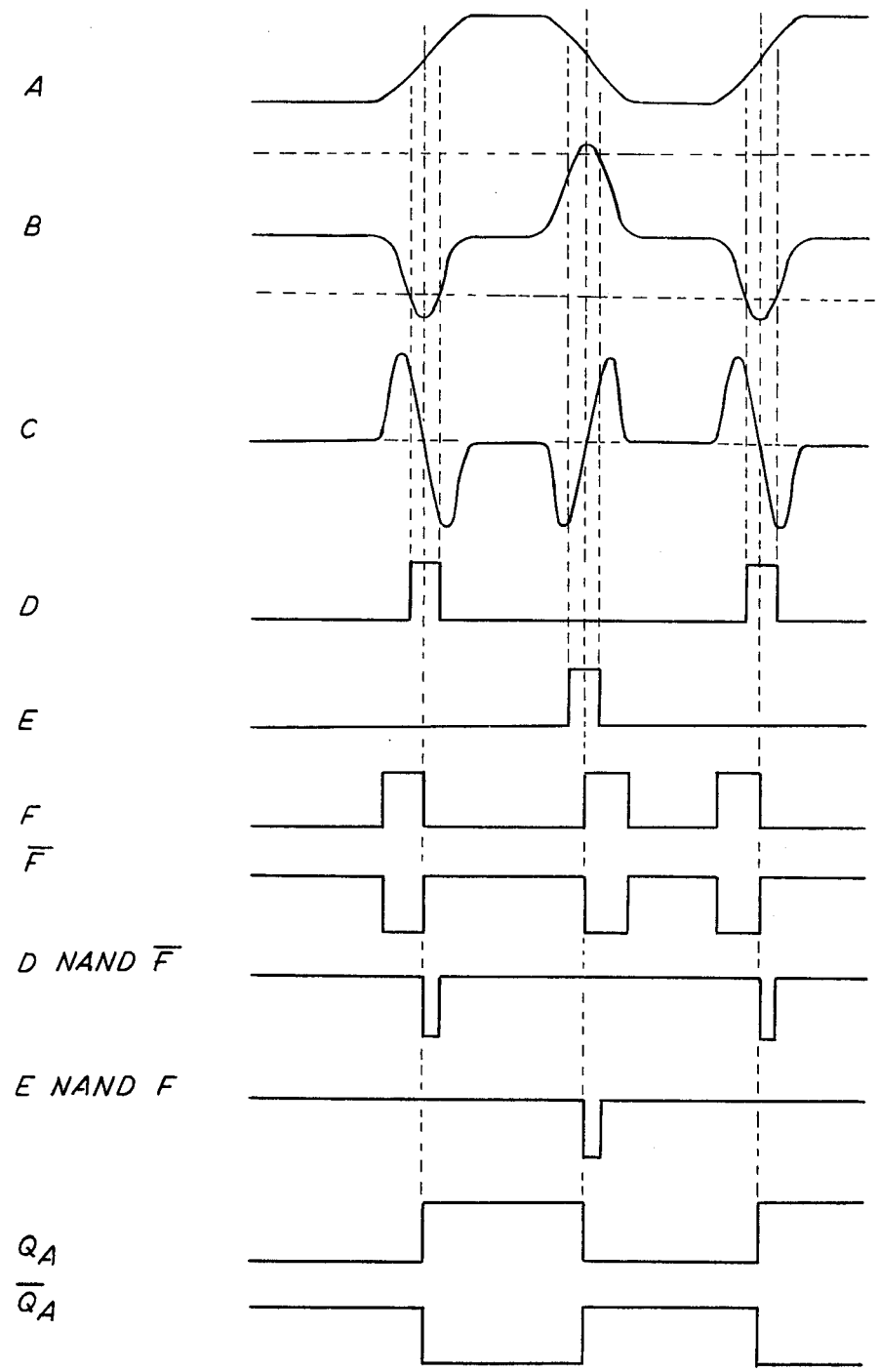
FIG. 2 is a diagram showing various waveforms associated with the circuit of FIG. 1.

A differentiator 17 differentiates the signal from amplifier 16 giving rise to waveform B in FIG. 2. As can be seen a peak occurs in waveform B wherever the slope value of the analog signal A is at a maximum.

A second differentiator 18 differentiates the output of differentiator 17 generating the waveform C in FIG. 2 which now has peaks corresponding to the points of maximum slope in the B waveform.

An adaptive threshold network 30 includes a peak detector 20 which is fed into a divider 21 which typically may divide by 2. The output of the divider 21 is termed the variable signal which is fed into an adaptive threshold selector 22. An invertor network 23 receives the output of the selector 22.

The adaptive threshold selector 22 receives the waveform as processed by the peak detector 20 and the divider 21 which is ultimately derived from the output of differentiator 17. The selector network 22 operates to provide an output which is dependent on the relationship between the input variable signal ($V_{Var}$) and a preselected fixed value of a DC voltage source 34 ($V_{Fixed}$).

Whenever the variable signal exceeds the fixed signal in amplitude, the variable signal appears at the output of the selector 22. Whenever the fixed signal is greater than the variable signal then the fixed signal appears at the output of the selector 22. In this manner a threshold signal which is immune to circuit noise and can accept wide variations in signal levels is achieved since the fixed component is selected to exceed circuit noise and the variable component depends on the amplitude of the incoming analog signal.

The output of selector 22 is fed to a comparator 24 which also receives the output of differentiator 17. The output of invertor 23 is fed to a comparator 25 which also receives output of differentiator 17.

The output of comparator 24 is a waveform containing a series of positive pulses around the points of maximum positive-going slope in the analog waveform A (FIG. 2). The output of comparator 25 is a waveform having positive pulses around the points of maximum negative slope of waveform A.

The comparator 19 which receives the output of differentiator 18 generates a pair of signals F and $\bar{F}$. The waveform F consists of a series of positive pulses each associated with the points of maximum slope of the input analog waveform. When the analog signal pulse has a rising edge its associated F pulse has its falling edge coinciding with the point of maximum positive slope of the analog signal. When the analog signal pulse has a falling edge its associated F pulse has its rising edge coinciding with the point of maximum negative slope of the analog signal.

It can also be seen that the width of each F pulse is determined by the crossing of the zero axis of the waveform at C. For example, the first pulse in the F train initiates when the C waveform first pulse rises above the zero axis and the second pulse in F ends when the second positive C pulse returns to zero.

The signal $\bar{F}$ is the inverted equivalent of the F signal. The F outout of comparator 19 is fed along with the E output of comparator 25 into a NAND gate 28. The $\bar{F}$ output of comparator 19 is fed along with the D output of comparator 24 into a NAND gate 26.

The output of NAND gate 26 is D NAND $\bar{F}$, a series of pulses in which the falling edge corresponds to the points of maximum positive slope of the input analog signal. The output of NAND gate 28 is E NAND F, a series of pulses in which the falling edge corresponds to the points of maximum negative slope of the analog signal.

The outputs of NAND gate 26 and 28 are fed to a flip-flop 35 comprised of a pair of NAND gates 27 and 29 interconnected in a well-known manner. The flip-flop 35 output consists of waveforms $Qa$ and $\overline{Qa}$.

The output waveform $Qa$ consists of a train of constant-amplitude pulses which coincide with the analog waveform A, the transition of each pulse occurring at the points of maximum slope of waveform A. Waveform $\overline{Qa}$ is the inverse of waveform $Qa$.

Waveforms $Qa$ and $\overline{Qa}$ may be fed to appropriate decoder circuitry such as that disclosed in patent application Ser. No. 682,246 for UPC Symbol Decoding System by Paul S. Wu and Robert V. Reago filed concurrently herewith and assigned to the assignee of the present invention.

In certain applications, a plurality of analog signals may be generated which may be advantageously processed by the present invention.

For example, a pair of sensors 11, 12 which may correspond to the sensors disclosed in patent application Ser. No. 574,137, filed May 2, 1975 by Paul S. Wu et al and assigned to the assignee of the present invention, receive signals $X_1$, $X_2$ which are generated as the result of scanning a coded symbol.

The signals are analog in nature and have an amplitude which may vary widely as a function of time.

Each sensor 11, 12 feeds an associated preamplifier 13, 14 which amplifies the respective analog signal levels for subsequent processing by the remaining system.

A multiplexer 15 receives the outputs of preamplifiers 13 and 14 as well as timing signals from each of the sensors which mark the initiation of sensing by the respective sensors and feeds the video amplifier 16 with a time division multiplexed signal whose amplitude may also vary widely with time. The multiplexed signal is then processed in accordance with the method disclosed herein.

Although two sensors 11, 12 are shown it is to be understood that the present invention can be utilized with any number of analog signal inputs, apropriately time-division multiplexed.

Accordingly, it is to be understood that many modifications and variations of the present invention will be obvious to those skilled in the art and, consequently, the scope of the invention is to be measured solely from the following claims.

What is claimed is:

1. An analog to digital wave shaping system comprising:
    a source of analog signals;
    first differentiator means having an input coupled to said source of analog signals and an output;
    inverter means having an input and an output;
    second differentiator means having an input connected to the output of said first differentiator means and an output;
    first comparator means having a pair of outputs, and having an input coupled to the output of said second differentiator;
    second comparator means having an input and an output;
    third comparator means having an input and an output;
    adaptive threshold selector means having an input coupled to said first differentiator means input, and an output;
    said adaptive threshold selector means including a fixed intensity signal source;
    said adaptive threshold selector means output being equal to the intensity of said fixed intensity signal source whenever said fixed intensity signal source intensity exceeds the intensity of said analog signals and being equal to the intensity of said analog signals whenever said fixed intensity signal source intensity is less than the intensity of said analog signals;
    said adaptive threshold selector means output being coupled to said second comparator means input and to said inverter means input;
    the output of said inverter means being coupled to an input of said third comparator means;
    the output of said first differentiator means being coupled to an input of said second comparator means and to an input of said third comparator means;
    first and second gate means; and
    flip-flop means;
    a first output of said first comparator and said second comparator output and a second output of said first comparator and said third comparator output being coupled to said first and second gate means, respectively;
    said first and second gate means each having an output coupled to said flip-flop means.

2. An analog to digital wave shaping system as set forth in claim 1, further comprising:
    peak detector means and divider means coupled between the output of said first differentiator means and the input of said first differentiator means and the input of said adaptive threshold selector means.

3. An analog to digital wave shaping system as set forth in claim 1, wherein:
    said fixed intensity signal source is a source of direct current.

* * * * *